United States Patent
Tsukizawa

(10) Patent No.: US 7,944,318 B2
(45) Date of Patent: May 17, 2011

(54) VOLTAGE CONTROLLED OSCILLATOR, AND PLL CIRCUIT AND RADIO COMMUNICATION DEVICE EACH INCLUDING THE SAME

(75) Inventor: Takayuki Tsukizawa, Osaka (JP)

(73) Assignee: Panasonic Corporation, Osaka (JP)

( * ) Notice: Subject to any disclaimer, the term of this patent is extended or adjusted under 35 U.S.C. 154(b) by 92 days.

(21) Appl. No.: 12/422,618

(22) Filed: Apr. 13, 2009

(65) Prior Publication Data

US 2009/0256643 A1   Oct. 15, 2009

(30) Foreign Application Priority Data

Apr. 14, 2008   (JP) .................................. 2008-104660

(51) Int. Cl.
*H03B 5/18* (2006.01)
(52) U.S. Cl. ................................. 331/117 R; 331/177 V
(58) Field of Classification Search .............. 331/117 R, 331/117 FE, 167, 177 R, 177 V, 179, 36 C, 331/34

See application file for complete search history.

(56) References Cited

U.S. PATENT DOCUMENTS

| | | | |
|---|---|---|---|
| 6,509,805 B2 * | 1/2003 | Ochiai | ..................... 331/117 FE |
| 6,995,626 B2 | 2/2006 | Oehm et al. | |
| 7,321,271 B2 | 1/2008 | Takinami et al. | |

FOREIGN PATENT DOCUMENTS

JP   2004-147310   5/2004

* cited by examiner

*Primary Examiner* — Ryan Johnson
(74) *Attorney, Agent, or Firm* — Wenderoth, Lind & Ponack, L.L.P.

(57) ABSTRACT

A voltage controlled oscillator includes an inductor circuit, C-coupling type variable capacitance circuits, a direct-coupling type variable capacitance circuit, and a negative resistance circuit, which are connected in parallel, and a reference voltage generating section that generates two reference voltages. A control voltage for feedback control of an oscillation frequency is applied to back gate terminals of variable capacitance elements of the variable capacitance circuits. The reference voltages are applied to gate terminals of the variable capacitance elements of the C-coupling type variable capacitance circuits, respectively.

6 Claims, 9 Drawing Sheets

VOLTAGE CONTROLLED OSCILLATOR, AND PLL CIRCUIT AND RADIO COMMUNICATION DEVICE EACH INCLUDING THE SAME

BACKGROUND OF THE INVENTION

1. Field of the Invention

The present invention relates to a voltage controlled oscillator used for generating a local oscillation signal for a radio communication device, and a PLL circuit and a radio communication device each including the same.

2. Description of the Background Art

A voltage controlled oscillator (VCO) is widely used as a device that generates a local oscillation signal for a radio communication device. FIG. 7 shows an exemplary configuration of a conventional voltage controlled oscillator. The conventional voltage controlled oscillator includes inductors 604a and 604b, variable capacitance elements 605a and 605b, oscillation transistors 603a and 603b, and a current source 601. It is noted that in FIG. 7, a bias circuit and the like are omitted.

The inductors 604a and 604b and the variable capacitance elements 605a and 605b constitute a parallel resonant circuit. The capacitance values of the variable capacitance elements 605a and 605b depend on the difference in voltage between both ends thereof. In other words, the capacitance values of the variable capacitance elements 605a and 605b vary in accordance with a control voltage Vt applied from an external circuit to a frequency control terminal 602, resulting in that the resonance frequency of the parallel resonant circuit varies. A set of the variable capacitance elements 605a and 605b are called a direct-coupling type variable capacitance circuit. Because the oscillation frequency of the conventional voltage controlled oscillator oscillates near the resonance frequency of the parallel resonant circuit, the oscillation frequency can be controlled so as to be a desired frequency by adjusting the control voltage Vt. The oscillation transistors 603a and 603b are provided for generating a negative resistance and canceling a loss, which occurs due to a parasitic resistance component of the parallel resonant circuit, to meet an oscillation condition.

Here, a relation between the control voltage and the oscillation frequency of the voltage controlled oscillator substantially depends on characteristics of the variable capacitance elements. Thus, the capacitance of a variable capacitance element to be used is desired to gradually vary throughout a wide range of the control voltage Vt. This is synonymous with that an oscillation frequency is desired to linearly vary throughout a wide range of the control voltage Vt.

In the case where a PLL (phase-locked loop) circuit is configured by using a conventional voltage controlled oscillator, the transient response characteristic and the noise band characteristic of the PLL circuit depend on a frequency sensitivity (the ratio of variation of the oscillation frequency with respect to the control voltage Vt). The reason why the gradual variation of the capacitance of the variable capacitance element is desired is that if the frequency sensitivity changes depending on the oscillation frequency (the oscillation frequency varies non-linearly), the characteristic of the PLL circuit also changes depending on the oscillation frequency. Further, there is a problem that in a high region of the frequency sensitivity with respect to the control voltage Vt, the oscillation frequency varies even due to slight noise applied to the frequency control terminal 602, resulting in deterioration of a phase noise characteristic.

However, if a special process is introduced for forming the variable capacitance elements 605a and 605b when the aforementioned conventional voltage controlled oscillator is realized on a semiconductor substrate, this leads to an increase in cost. Thus, it is actually difficult to use a variable capacitance element having high linearity. FIG. 8A is a symbol representing an Inversion type MOS transistor that is an example of a variable capacitance element and that utilizes a gate capacitance, which is widely used in a CMOS process, between a gate terminal and a terminal connected to a drain terminal and a source terminal. FIG. 8B shows a variation of the gate capacitance when a reference voltage Vref is applied to the gate terminal of the MOS transistor and a control voltage Vt is applied to the drain terminal and the source terminal of the MOS transistor.

Because the capacitance value rapidly varies near a threshold voltage (a voltage Vth in FIG. 8B) in a variable capacitance element that utilizes the gate capacitance of a generally-used MOS transistor as shown in FIG. 8B, the oscillation frequency also rapidly varies near the threshold voltage. This results in a problem that the transient response characteristic and the noise band characteristic of a PLL circuit including a conventional voltage controlled oscillator change drastically depending on the oscillation frequency.

In order to solve this problem, a below-described circuit has been already proposed.

FIG. 9 is a view of a conventional voltage controlled oscillator using a method that improves the linearity of a variable capacitance element (e.g. see U.S. Pat. No. 6,995,626 (Patent Document 1)).

As shown in FIG. 9, the conventional voltage controlled oscillator includes inductors 604a and 604b, variable capacitance elements 605a, 605b, 606a, 606b, 607a, and 607b, DC-cut capacitance elements 608a, 608b, 609a, 609b, 610a, and 610b for blocking a direct current component, high frequency interruption resistors 611a, 611b, 612a, 612b, 613a, and 613b, oscillation transistors 603a and 603b, and a current source 601. In FIG. 9, the same components as those in FIG. 7 are designated by the same reference characters, and the description thereof will not be provided.

The variable capacitance elements 605a and 605b and the DC-cut capacitance elements 603a and 608b constitute a variable capacitance circuit A. The variable capacitance elements 606a and 606b and the DC-cut capacitance elements 609a and 609b constitute a variable capacitance circuit B. The variable capacitance elements 607a and 607b and the DC-cut capacitance elements 610a and 610b constitute a variable capacitance circuit C. The variable capacitance elements 605a, 605b, 606a, 606b, 607a, and 607b are Inversion type MOS transistors each of which utilizes a gate capacitance, which is used in a CMOS process, between a gate terminal and a terminal connected to a drain terminal and a source terminal. In the variable capacitance circuits A to C, the capacitance values of the variable capacitance elements vary depending on reference voltages Vref1 to Vref3 inputted to connection points between the variable capacitance elements and the DC-cut capacitance elements and a control voltage Vt applied to a frequency control terminal 602. As a result, the resonance frequency of a parallel resonant circuit varies. The variable capacitance circuits A to C are called C-coupling type variable capacitance circuits.

Here, if each of the differences among the reference voltages Vref1 to Vref3 is a voltage Vd, the characteristics of the variable capacitance circuits A to C with respect to the control voltage Vt are shifted from each other by Vd. Patent Document 1 shows an example where Vd=160 mV (FIG. 10A). The capacitance of the parallel resonant circuit is the total of the capacitances of the variable capacitance circuits A to C. Thus, the total capacitance has a characteristic as indicated by a chain line in FIG. 10B, and variation of the capacitance with respect to the control voltage Vt can be gradual.

The oscillation frequency fo of the voltage controlled oscillator is represented by the following formula [1] where L denotes the inductance of the inductor of the parallel resonant circuit, Cv denotes the total of the capacitance values of the variable capacitance circuits A to C, and C denotes the capacitance value of a parasitic capacitance generated at a negative resistance circuit and the like.

$$f_0 = \frac{1}{2\pi\sqrt{L \times (C_V + C)}} \qquad [1]$$

When the formula [1] is solved with respect to the total capacitance value Cv of the variable capacitance circuits A to C, the formula [1] becomes the following formula [2].

$$C_V = \frac{1}{4\pi^2 f_0^2 \times L} - C \qquad [2]$$

The inductance L and the capacitance value C of the parasitic capacitance are constant. Thus, in order to cause the oscillation frequency fo to vary linearly with respect to the control voltage Vt, the total capacitance value Cv of the variable capacitance circuits A to C is desired to be proportional to $1/(fo^2)$, not caused to vary linearly.

Further, it is known that the variation range of the capacitance value of a C-coupling type variable capacitance circuit is narrower than that of a direct-coupling type variable capacitance circuit, in other words, the capacitance variation ratio is smaller.

For example, a case is considered where the variation range of the capacitance value in the direct-coupling type variable capacitance circuit is from CH to CL when the control voltage Vt is changed from High to Low (see FIG. 8B), the capacitance value of the variable capacitance element of the c-coupling type variable capacitance circuit is represented by Cx, and the capacitance value of the DC-cut capacitance element thereof is set to CH. In this case, the composite capacitance value Ctotal of the C-coupling type variable capacitance circuit is represented by the following formula [3].

$$C_{total} = \frac{CH \times Cx}{CH + Cx} \qquad [3]$$

In the formula [3], when the control voltage Vt is at High (Cx=CH), the composite capacitance value Ctotal becomes CH/2. On the other hand, when the control voltage Vt is at Low (Cx=CL), the composite capacitance value Ctotal becomes CL (∵CH>>CL). In other words, the upper limit of the variation range of the capacitance value of the C-coupling type variable capacitance circuit is smaller than that of the direct-coupling type variable capacitance circuit by "CH/2".

Thus, in the conventional improvement method described above, the capacitance can be caused to vary gradually with respect to the control voltage Vt, thereby allowing the capacitance variation in a wide range of the control voltage Vt, namely, improvement in the linearity of the oscillation frequency. However, there is a problem that because many C-coupling type variable capacitance circuits are connected in parallel, the capacitance variation ratio becomes small, and hence the variation range of the oscillation frequency of the voltage controlled oscillator becomes narrow.

SUMMARY OF THE INVENTION

Therefore, an object of the present invention is to provide a voltage controlled oscillator that is configured by arranging C-coupling type variable capacitance circuits and a direct-coupling type variable capacitance circuit in a suitable manner and in which the linearity and the variable range of the oscillation frequency are well-balanced, and a PLL circuit and a radio communication device each including the same.

The present invention is directed to a voltage controlled oscillator, and a PLL circuit and a radio communication device each including the voltage controlled oscillator. In order to achieve the above object, the voltage controlled oscillator of the present invention comprises: an inductor circuit that includes an inductor; a plurality of C-coupling type variable capacitance circuits each of which includes two variable capacitance elements connected in series and two blocking capacitors connected to both ends of the two variable capacitance elements for blocking a direct current component; at least one direct-coupling type variable capacitance circuit that includes two variable capacitance elements connected in series; a negative resistance circuit; and a reference voltage generating section that generates a plurality of reference voltages to be supplied to said plurality of C-coupling type variable capacitance circuits, respectively. Said inductor circuit, said plurality of C-coupling type variable capacitance circuits, said at least one direct-coupling type variable capacitance circuit, and said negative resistance circuit are connected in parallel. Said plurality of reference voltages are inputted to terminals of the variable capacitance elements of said plurality of C-coupling type variable capacitance circuits, respectively. A control voltage for feedback control of an oscillation frequency is inputted to the other terminals of the variable capacitance elements of said plurality of C-coupling type variable capacitance circuits and terminals of the variable capacitance elements of said at least one direct-coupling type variable capacitance circuit. A variable capacitance circuit with the greatest threshold voltage about which a variation range of a capacitance value thereof is centered and a variable capacitance circuit with the smallest threshold voltage about which a variation range of a capacitance value thereof is centered are at least C-coupling type variable capacitance circuits.

In this configuration, preferably, differences between a threshold voltage of said at least one direct-coupling type variable capacitance circuit and threshold voltages of said plurality of C-coupling type variable capacitance circuits, or a capacitance value of said at least one direct-coupling type variable capacitance circuit and capacitance values of said plurality of C-coupling type variable capacitance circuits, are set in a range that meets linearity of a frequency characteristic.

Further, at least one of the variable capacitance elements of said plurality of C-coupling type variable capacitance circuits and said at least one direct-coupling type variable capacitance circuit is an Inversion type or Accumulation type MOS transistor.

According to the present invention, a voltage controlled oscillator, in which the linearity and the variation range of the oscillation frequency are well-balanced, and a PLL circuit and a radio communication device each including the same, can be realized.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
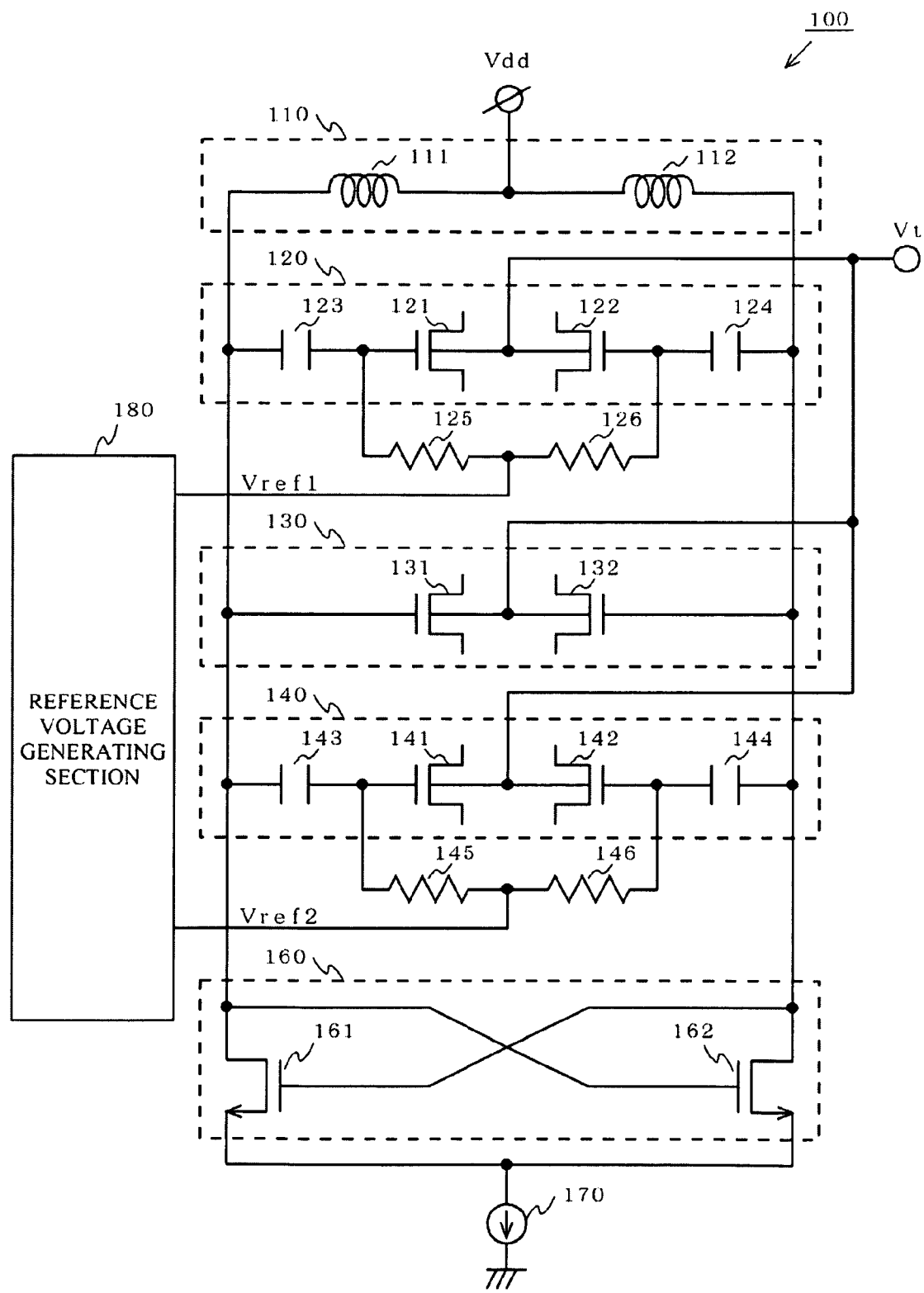
FIG. 1 is a view showing a configuration of a voltage controlled oscillator according to an embodiment of the present invention.

FIG. 1 is a view showing an exemplary configuration of a voltage controlled oscillator 100 according to an embodiment of the present invention. It is noted that a bias circuit and the like are omitted in FIG. 1. As shown in FIG. 1, the voltage controlled oscillator 100 of the present embodiment includes an inductor circuit 110, C-coupling type variable capacitance circuits 120 and 140, a direct-coupling type variable capacitance circuit 130, a negative resistance circuit 160, a current source 170, and a reference voltage generating section 180. The inductor circuit 110, the C-coupling type variable capacitance circuits 120 and 140, the direct-coupling type variable capacitance circuit 130, and the negative resistance circuit 160 are connected in parallel to each other and constitute an oscillation circuit.

The inductor circuit 110 includes inductors 111 and 112 connected in series, and a power supply voltage Vdd is supplied to the connection point between the inductors 111 and 112. The negative resistance circuit 160 is configured in such a manner that two oscillation transistors 161 and 162 are cross-coupled. The oscillation transistors 161 and 162 are suitably MOS transistors or bipolar transistors.

The C-coupling type variable capacitance circuit 120 includes: variable capacitance elements 121 and 122 whose back gate terminals are connected to each other; and DC-cut capacitance elements (blocking capacitors) 123 and 124 that are connected in series to gate terminals of the variable capacitance elements 121 and 122, respectively. A control voltage Vt for feedback control of an oscillation frequency is applied to the back gate terminals of the variable capacitance elements 121 and 122. Similarly, the C-coupling type variable capacitance circuit 140 includes: variable capacitance elements 141 and 142 whose back gate terminals are connected to each other; and DC-cut capacitance elements 143 and 144 that are connected in series to gate terminals of the variable capacitance elements 141 and 142, respectively. The control voltage Vt for the feedback control of the oscillation frequency is applied to the back gate terminals of the variable capacitance elements 141 and 142. The direct-coupling type variable capacitance circuit 130 includes variable capacitance elements 131 and 132 whose back gate terminals are connected to each other. The variable capacitance elements 121, 122, 131, 132, 141, and 142 are MOS transistors (described later) each of which utilizes a gate capacitance, which is used in a CMOS process.

Further, a reference voltage Vref1 is supplied from the reference voltage generating section 180 to the gate terminals of the variable capacitance elements 121 and 122 of the C-coupling type variable capacitance circuit 120 via resistors 125 and 126, respectively. A reference voltage Vref2 is supplied from the reference voltage generating section 180 to the gate terminals of the variable capacitance elements 141 and 142 of the C-coupling type variable capacitance circuit 140 via resistors 145 and 146, respectively.

Figure 2A:
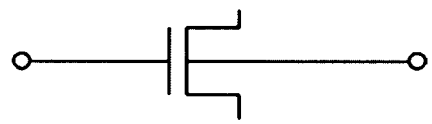
FIG. 2A is a view of an element used as a variable capacitance element of the voltage controlled oscillator of the present invention.
Figure 2B:
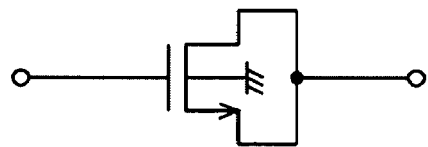
FIG. 2B is a view of an element used as a variable capacitance element of a conventional voltage controlled oscillator.
Figure 2C:
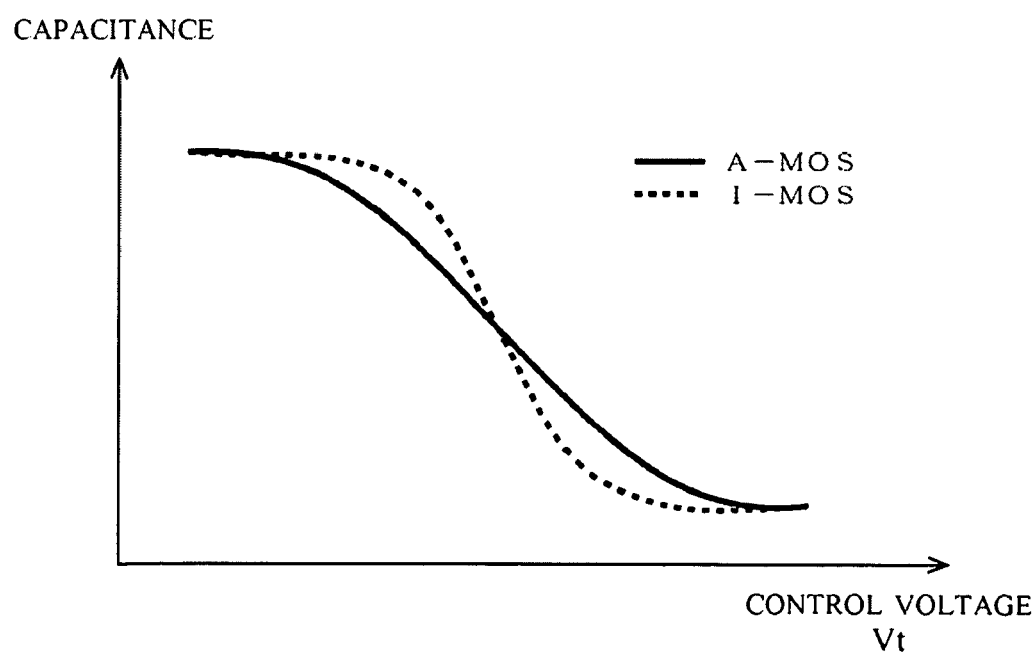
FIG. 2C is a view showing comparison of capacitance characteristics of the variable capacitance element of the present invention and the conventional variable capacitance element.

FIG. 2A is a view of an Accumulation type MOS transistor (hereinafter, referred to as an A-MOS transistor), used as the variable capacitance elements 121, 122, 131, 132, 141, and 142 of the present invention, which utilizes a gate capacitance, which is used in a CMOS process, between a gate terminal and a back gate terminal. The capacitance value of the A-MOS transistor varies more gradually with respect to the control voltage Vt than that of an Inversion type MOS transistor shown in FIG. 2B (see FIG. 2C).

The following will describe an operation of the voltage controlled oscillator according to the embodiment of the present invention.

Figure 3:
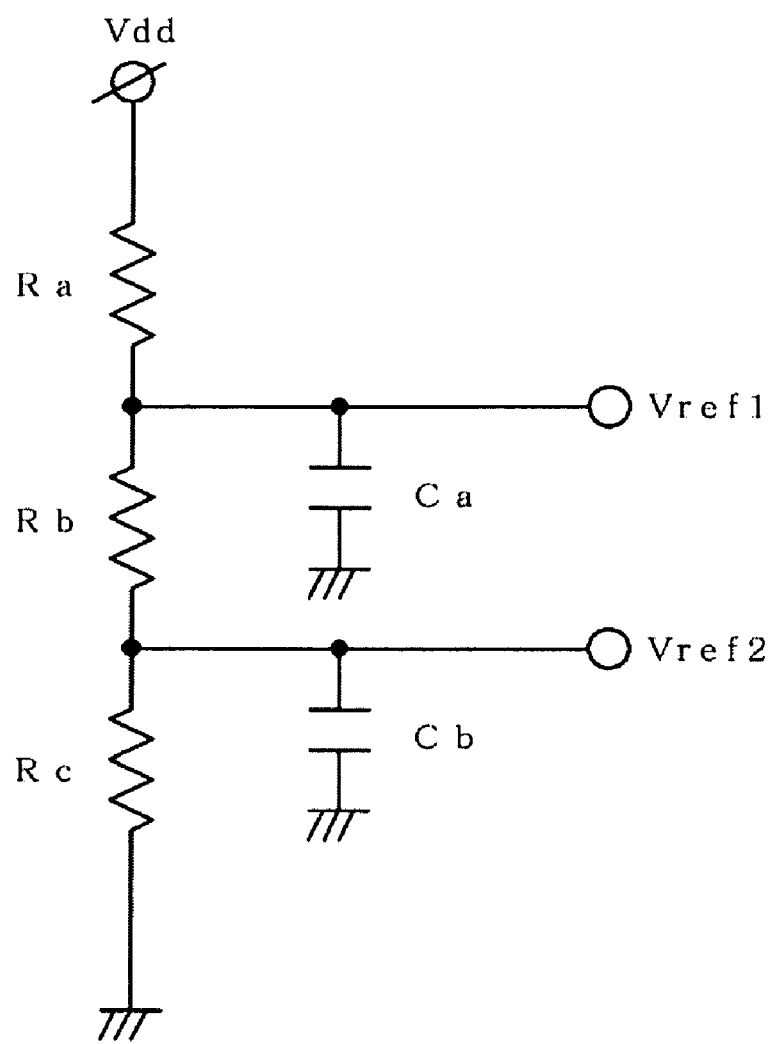
FIG. 3 is a view showing in detail an exemplary configuration of a reference voltage generating section 180.

FIG. 3 is a view showing in detail an exemplary configuration of the reference voltage generating section 180. As shown in FIG. 3, the reference voltage generating section 180 includes: resistors Ra to Rc that are connected in series between a position of the power supply voltage Vdd and a position of a predetermined voltage (a ground voltage in this example); and capacitance elements Ca and Cb that ground the connection points among the resistors Ra to Rc. A voltage at the connection point between the resistors Ra and Rb and a voltage at the connection point between the resistors Rb and Rc are outputted as the reference voltage Vref1 and the reference voltage Vref2, respectively.

The capacitance elements Ca and Cb are bypass capacitance elements for reducing noise outputted from the reference voltage generating section 180. Thus, even if the capacitance elements Ca and Cb are connected to paths through which the reference voltages Vref1 and Vref2 are supplied, respectively, the capacitance elements Ca and Cb do not influence the transient response and the noise band characteristic of a PLL circuit. Thus, the capacitance elements Ca and Cb with sufficient capacities required to reduce the noise can be freely inserted. It is noted that even if the capacitance elements Ca and Cb are not provided, the effects of the present invention are not changed.

The reference voltages Vref1 and Vref2 in the reference voltage generating section 180 of FIG. 3 are represented by the following formulas [4] and [5], respectively.

$$V_{ref1} = \frac{Vdd \times (Rb + Rc)}{Ra + Rb + Rc} \quad [4]$$

$$V_{ref2} = \frac{Vdd \times Rc}{Ra + Rb + Rc} \quad [5]$$

When the voltage Vdd is a direct current (DC), the reference voltages Vref1 and Vref2 are also direct currents (DCs) Further, reference voltages having a desired difference therebetween can be generated at the reference voltage generating section 180 by appropriately deciding the values of the resistors Ra to Rc.

Figure 4:
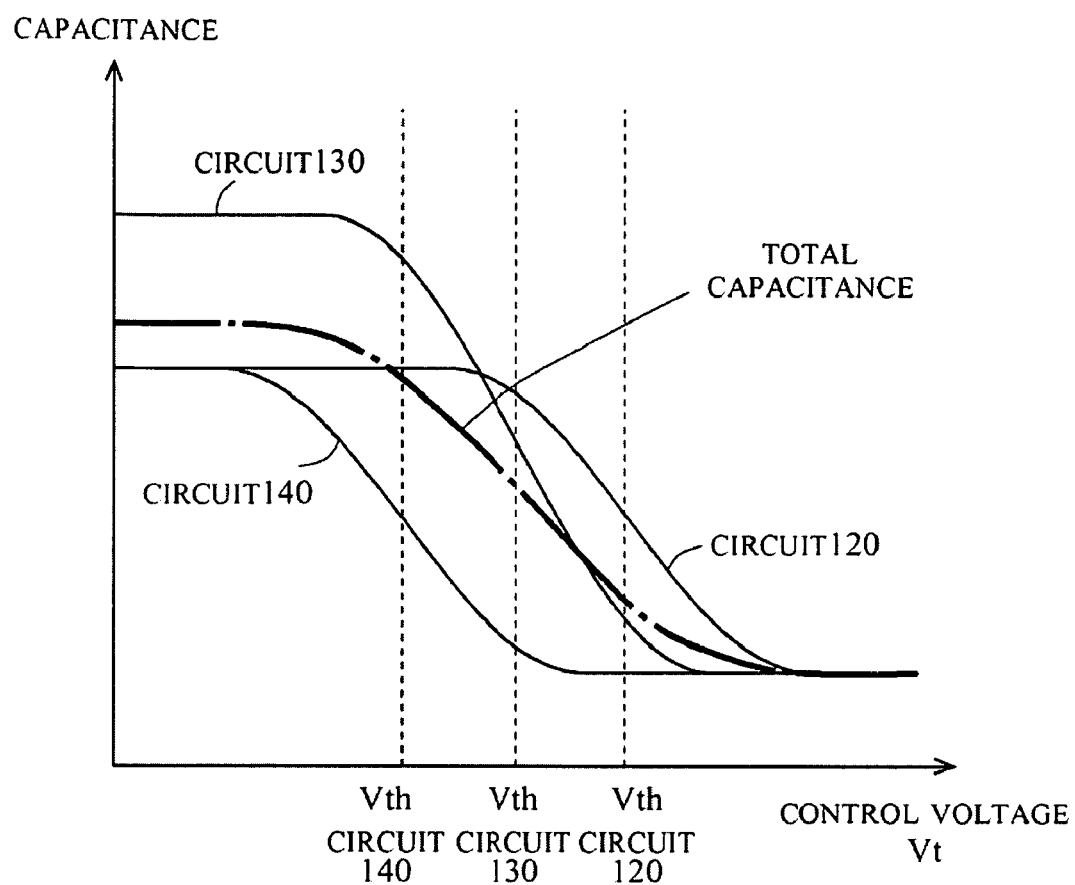
FIG. 4 is a view showing a capacitance characteristic of the variable capacitance circuit according to the embodiment of the present invention.
Figure 10A:
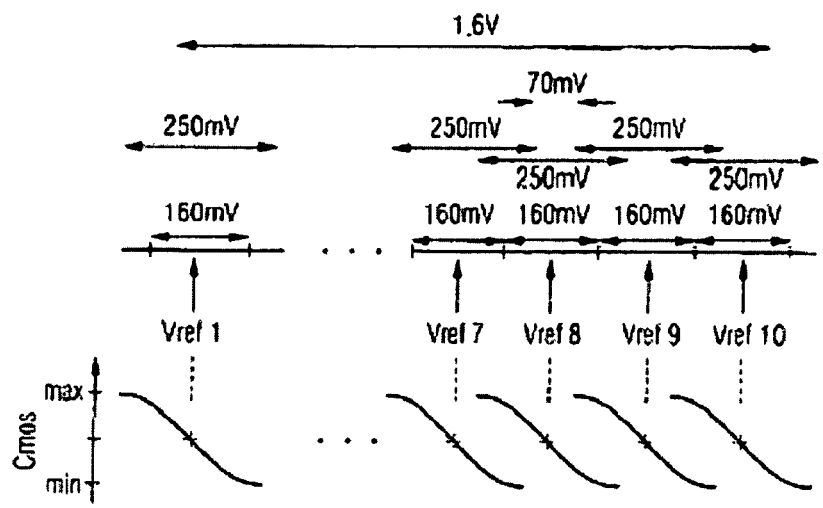
FIGS. 10A and 10B show capacitance characteristics of variable capacitance elements of the other conventional voltage controlled oscillator.
Figure 10B:
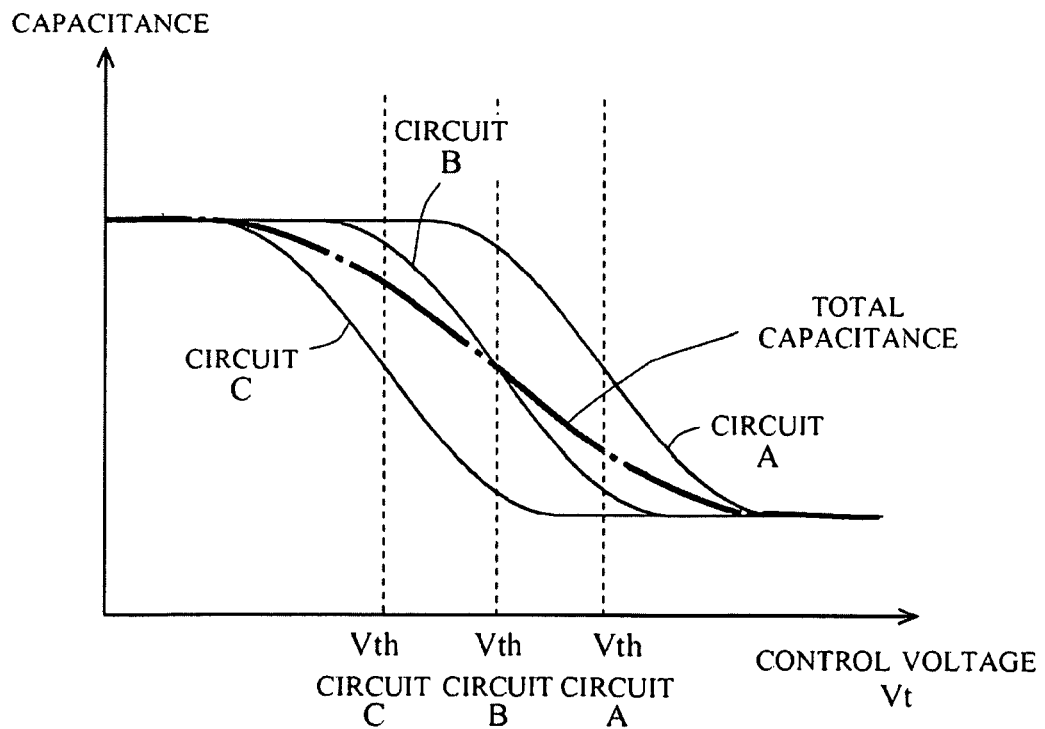

Now, a case is considered where "reference voltage Vref1">"reference voltage Vref2", "capacitance values of the variable capacitance elements 121 and 122"="capacitance values of the variable capacitance elements 131 and 132"="capacitance values of the variable capacitance elements 141 and 142", and "capacitance values of the DC-cut capacitance elements 123 and 124"="capacitance values of the DC-cut capacitance elements 143 and 144". In this case, if it is assumed that the capacitance of each variable capacitance element varies near the control voltage Vt=Vth, the capacitance values of the variable capacitance circuits 120 to 140 vary with respect to the control voltage Vt as shown in FIG. 4. Thus, the variation range (a chain line in FIG. 4) of the total capacitance of the variable capacitance circuits 120 to 140 can be wider than that in a conventional example (FIG. 10B).

As described above, according to the voltage controlled oscillator 100 of the present invention, the differences between the threshold voltage at the direct-coupling type variable capacitance circuit 130 and the threshold voltages at the C-coupling type variable capacitance circuits 120 and 140, or the capacitance value of the direct-coupling type variable capacitance circuit 130 and the capacitance values of the C-coupling type variable capacitance circuit 120 and 140 are set in a range that meets the linearity of the frequency characteristics. Thus, the variation range of the oscillation frequency does not become excessively narrow, and a characteristic is obtained in which the linearity and the variation range of the oscillation frequency are well-balanced.

The present embodiment has described the case where the three variable capacitance circuits are connected in parallel. However, four or more variable capacitance circuits are connected in parallel. In this case, the variable capacitance circuit with the greatest threshold voltage Vth about which the variation range of the capacitance value thereof is centered, and the variable capacitance circuit with the smallest threshold voltage Vth about which the variation range of the capacitance value thereof is centered, may be at least C-coupling type variable capacitance circuits.

Further, the present embodiment has described the configuration in which the control voltage Vt is supplied to the back gate terminals of the A-MOS transistors. However, the control voltage Vt may be supplied to the gate terminals of the A-MOS transistors. Further, even if, instead of the MOS transistors, bipolar transistors are used as the oscillation transistors 161 and 162, the same effects are obtained. In addition, even if, instead of being connected to the negative resistance circuit, the current source 170 is connected between the supply terminal of the power supply voltage Vdd and the inductor circuit 110, the same effects are obtained.

(Exemplary Configuration Using Voltage Controlled Oscillator)

Figure 5:
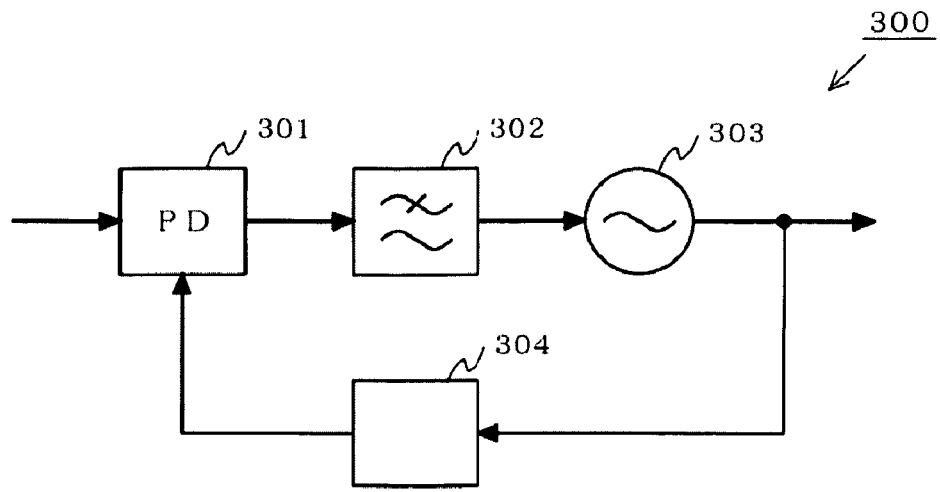
FIG. 5 is a view showing a configuration of a PLL circuit 300 including the voltage controlled oscillator of the present invention.

FIG. 5 is a view showing an exemplary configuration of a PLL circuit 300 including the voltage controlled oscillator according to the embodiment of the present invention. As shown in FIG. 5, the PLL circuit 300 includes a phase comparator 301, a loop filter 302, a voltage controlled oscillator 303 according to the present invention, and a frequency divider 304.

The phase comparator 301 compares an inputted reference signal with a signal obtained by the frequency divider 304 dividing an output signal of the voltage controlled oscillator 303. A signal outputted from the phase comparator 301 is inputted as a control voltage Vt to the frequency control terminal of the voltage controlled oscillator 303 via the loop filter 302. The voltage controlled oscillator 303 outputs a signal of a desired frequency based on the control voltage Vt. According to this configuration, the PLL circuit 300 locks the desired frequency. It is noted that a mixer may be used instead of the frequency divider 304, or the frequency divider 304 and a mixer may be used in combination.

Figure 6:
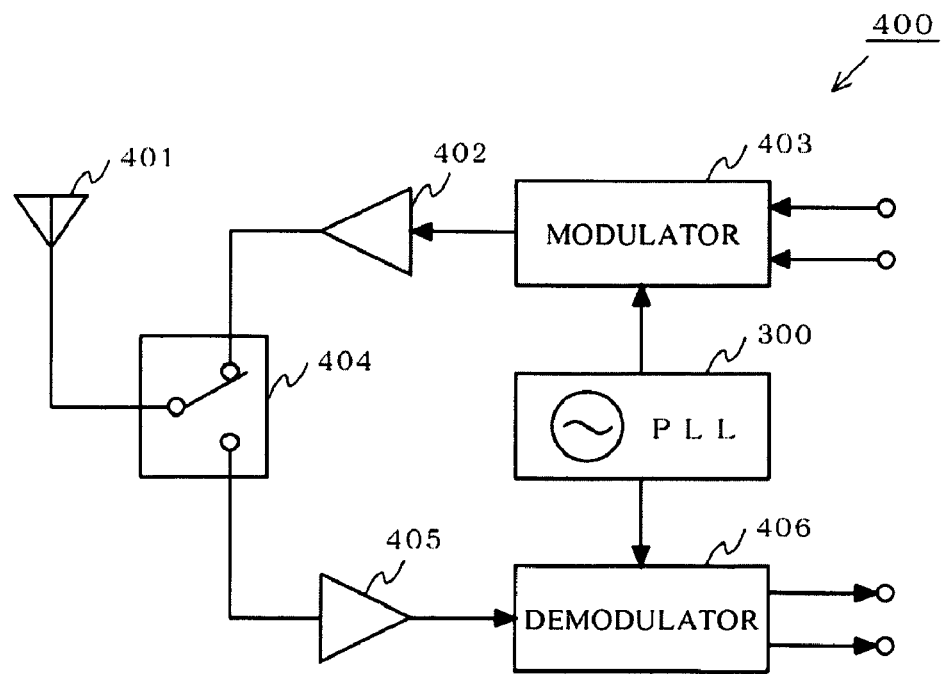
FIG. 6 is a view showing a configuration of a radio communication device including the PLL circuit in FIG. 5.
Figure 7:
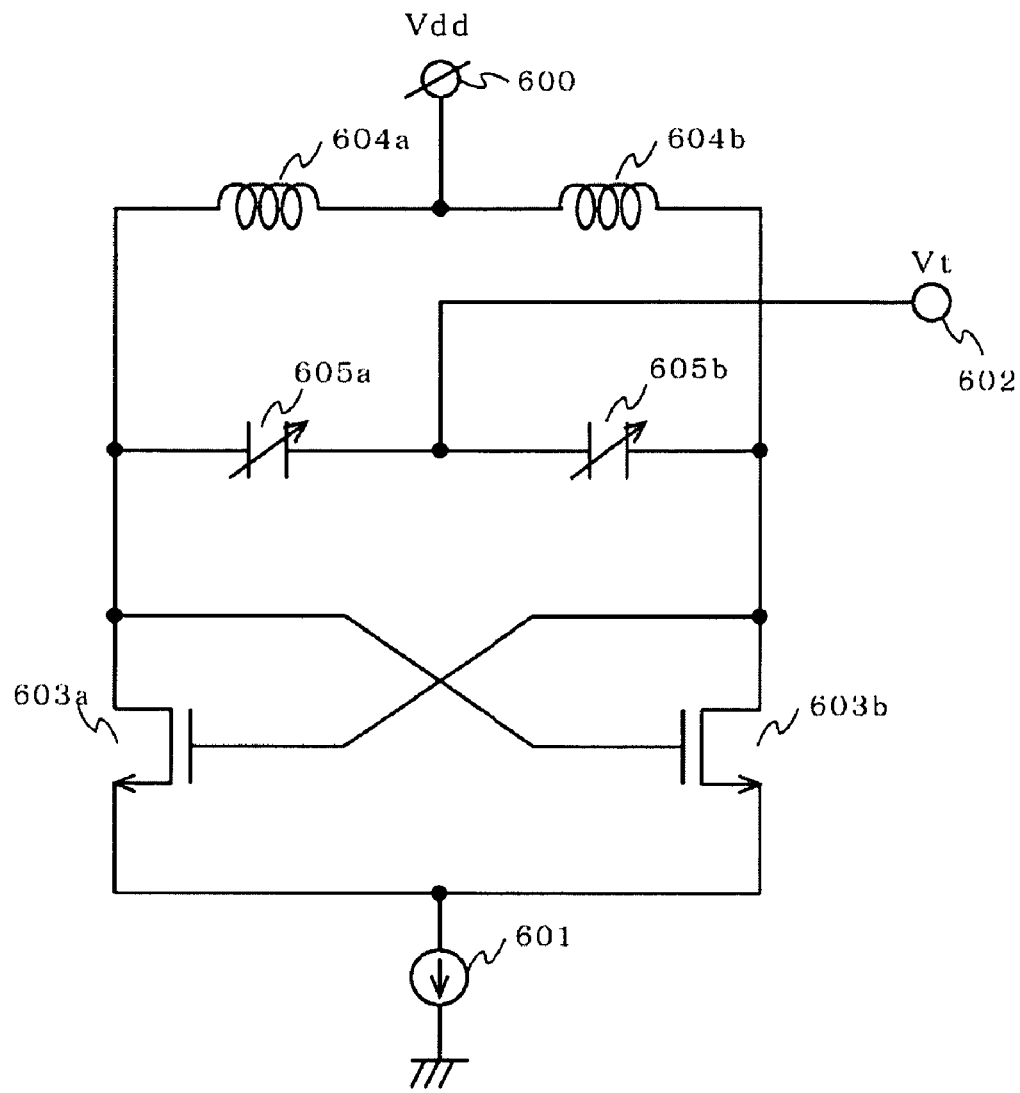
FIG. 7 is a view showing a configuration of a conventional voltage controlled oscillator.
Figure 8A:
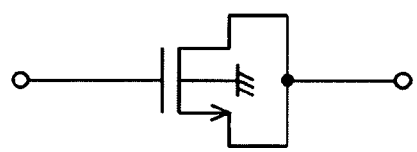
FIG. 8A is a view of an element used as a variable capacitance element of the conventional voltage controlled oscillator.
Figure 8B:
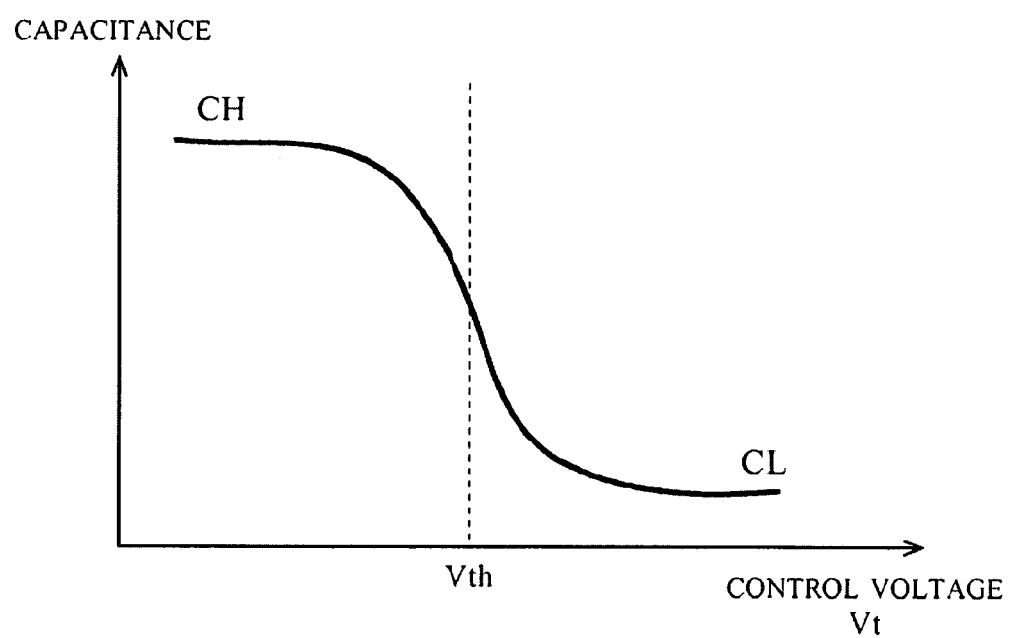
FIG. 8B is a view showing a capacitance characteristic of the variable capacitance element of the conventional voltage controlled oscillator.
Figure 9:
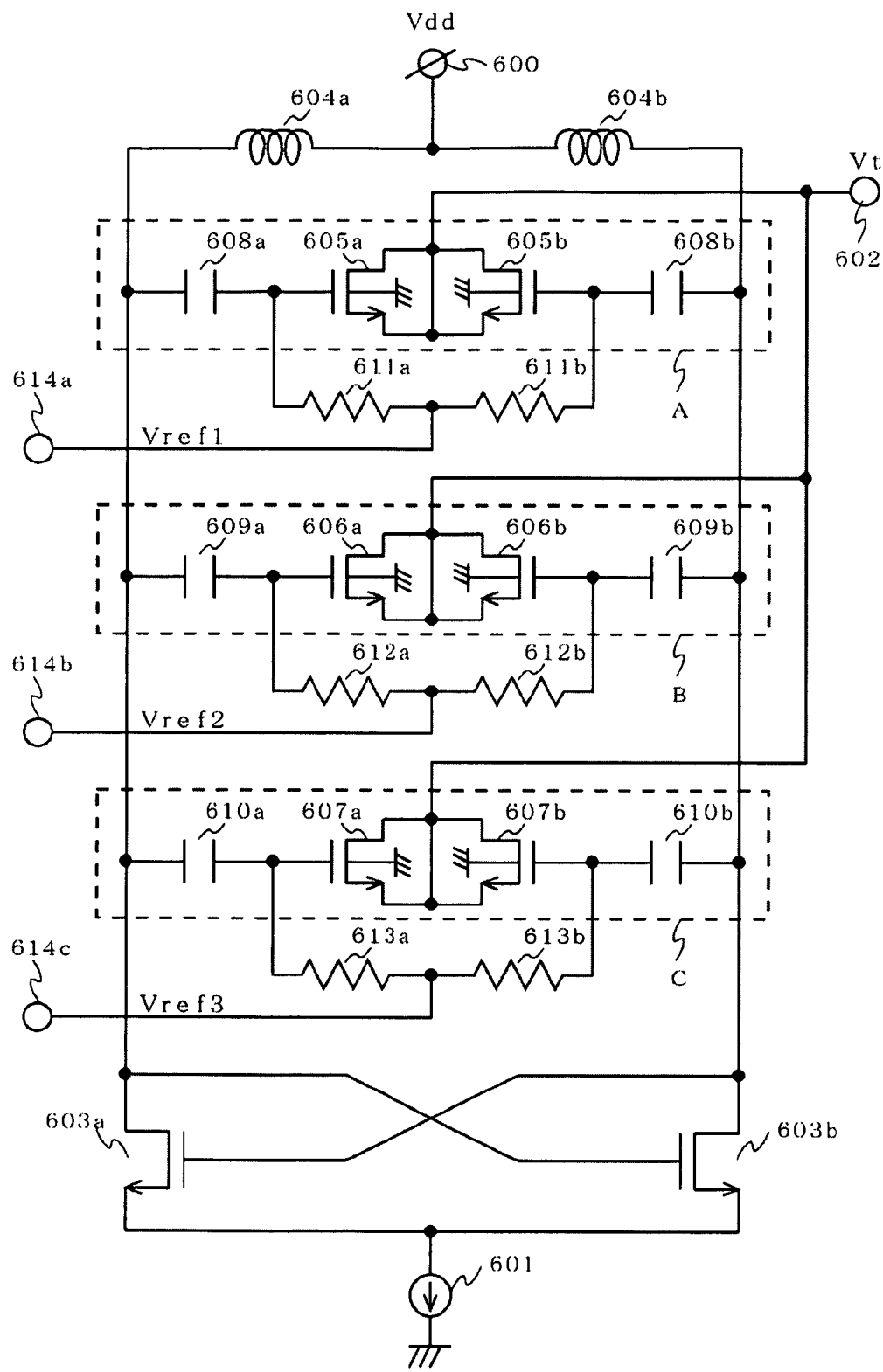
FIG. 9 is a view showing a configuration of another conventional voltage controlled oscillator.

Further, FIG. 6 is a view showing an exemplary configuration of a radio communication device 400 including the above PLL circuit 300. As shown in FIG. 6, the radio communication device 400 includes an antenna 401, a power amplifier 402, a modulator 403, a switch 404, a low noise amplifier 405, a demodulator 406, and the PLL circuit 300.

When a radio signal is transmitted, the modulator 403 modulates a desired radio frequency signal, outputted from the PLL circuit 300, with a baseband modulation signal, and outputs the resultant signal. The radio frequency signal outputted from the modulator 403 is amplified by the power amplifier 402, and radiated from the antenna 401 via the switch 404. When a radio signal is received, a radio frequency signal received by the antenna 401 is inputted to the low noise amplifier 405 via the switch 404, amplified, and inputted to the demodulator 406. The demodulator 406 demodulates the inputted radio frequency signal into a baseband modulation signal by using the radio frequency signal outputted from the PLL circuit 300. It is noted that the PLL circuit 300 may be used at each of the transmitting side and the receiving side. Further, the PLL circuit 300 is provided with a modulator.

As described above, a PLL circuit and a radio communication device, in which the linearity and the variation range of the oscillation frequency are well-balanced, can be realized.

While the invention has been described in detail, the foregoing description is in all aspects illustrative and not restrictive. It is understood that numerous other modifications and variations can be devised without departing from the scope of the invention.

What is claimed is:

1. A voltage controlled oscillator comprising:
an inductor circuit that includes an inductor;
a plurality of C-coupling type variable capacitance circuits each of which includes two variable capacitance elements connected in series at first terminals thereof, and two blocking capacitors having first electrodes connected to second terminals of said two variable capacitance elements, respectively, for blocking a direct current component, said plurality of C-coupling type variable capacitance circuits each being connected in parallel to said inductor circuit by second electrodes of said two blocking capacitors being connected to said inductor;

at least one direct-coupling type variable capacitance circuit that includes only two variable capacitance elements connected in series at first terminals thereof and that is connected in parallel to said inductor circuit by second terminals of said two variable capacitance elements being directly connected to said inductor;

a negative resistance circuit connected in parallel to said inductor circuit; and a reference voltage generating section for generating a plurality of reference voltages to be supplied to said plurality of C-coupling type variable capacitance circuits, respectively, wherein:

the plurality of reference voltages are inputted to the second terminals of said variable capacitance elements of said plurality of C-coupling type variable capacitance circuits, respectively;

a control voltage for feedback control of an oscillation frequency is inputted to the first terminals of said variable capacitance elements of said plurality of C-coupling type variable capacitance circuits and the first terminals of said variable capacitance elements of said at least one direct-coupling type variable capacitance circuit; and a variable capacitance circuit with a greatest threshold voltage about which a variation range of a capacitance value thereof is centered and a variable capacitance circuit with a smallest threshold voltage about which a variation range of a capacitance value thereof is centered are at least C-coupling type variable capacitance circuits of said C-coupling type variable capacitance circuits.

2. The voltage controlled oscillator according to claim 1, wherein differences between a threshold voltage of said at least one direct-coupling type variable capacitance circuit and threshold voltages of said plurality of C-coupling type variable capacitance circuits are set in a range that meets linearity of a frequency characteristic.

3. The voltage controlled oscillator according to claim 1, wherein a capacitance value of said at least one direct-coupling type variable capacitance circuit and capacitance values of said plurality of C-coupling type variable capacitance circuits are set in a range that meets linearity of a frequency characteristic.

4. The voltage controlled oscillator according to claim 1, wherein at least one of said variable capacitance elements of said plurality of C-coupling type variable capacitance circuits and said at least one direct-coupling type variable capacitance circuit is an Inversion type or Accumulation type MOS transistor.

5. A PLL circuit comprising a voltage controlled oscillator according to claim 1.

6. A radio communication device comprising a voltage controlled oscillator according to claim 1.

* * * * *